US012562010B2

(12) United States Patent
Wang

(10) Patent No.: US 12,562,010 B2
(45) Date of Patent: Feb. 24, 2026

(54) VEHICLE REMOTE DIAGNOSIS SYSTEM AND METHOD

(71) Applicant: Autel Intelligent Technology Corp., Ltd., Shenzhen (CN)

(72) Inventor: Yongchao Wang, Shenzhen (CN)

(73) Assignee: AUTEL INTELLIGENT TECHNOLOGY CORP., LTD., Shenzhen (CN)

( * ) Notice: Subject to any disclaimer, the term of this patent is extended or adjusted under 35 U.S.C. 154(b) by 154 days.

(21) Appl. No.: 18/556,359

(22) PCT Filed: Apr. 12, 2022

(86) PCT No.: PCT/CN2022/086244
§ 371 (c)(1),
(2) Date: Oct. 20, 2023

(87) PCT Pub. No.: WO2022/222782
PCT Pub. Date: Oct. 27, 2022

(65) Prior Publication Data
US 2024/0212400 A1     Jun. 27, 2024

(30) Foreign Application Priority Data

Apr. 22, 2021     (CN) .......................... 202110436747.1

(51) Int. Cl.
*G07C 5/00*          (2006.01)
*G01R 31/3835*     (2019.01)
(Continued)

(52) U.S. Cl.
CPC ......... *G07C 5/008* (2013.01); *G01R 31/3835* (2019.01); *G06F 30/20* (2020.01); *G07C 5/0833* (2013.01)

(58) Field of Classification Search
CPC .. G07C 5/008; G07C 5/0833; G01R 31/3835; G06F 30/20; G05B 23/0237; G05B 23/0213; Y02T 90/16
See application file for complete search history.

(56) References Cited

FOREIGN PATENT DOCUMENTS

CN          102073319 A     5/2011
CN          204359914 U     5/2015
(Continued)

OTHER PUBLICATIONS

Machine Translation CN111273641 (Year: 2020).*
(Continued)

*Primary Examiner* — Anne Marie Antonucci
(74) *Attorney, Agent, or Firm* — Andrew C. Cheng

(57) ABSTRACT

A vehicle remote diagnosis system includes a local VCI device, a remote VCI device, a vehicle battery simulator and a vehicle diagnosis instrument, wherein the local VCI device is connected to a vehicle; the remote VCI device is in communication connection with the local VCI device; the vehicle battery simulator is connected to the remote VCI device, and the vehicle battery simulator can simulate the voltage of a battery of the vehicle to supply power to the remote VCI device; the vehicle diagnosis instrument is connected to the remote VCI device; and the vehicle diagnosis instrument can send a diagnosis command to the vehicle by means of the remote VCI device and the local VCI device, so as to acquire diagnosis data, which is fed back by the vehicle on the basis of the diagnosis command. The voltage of the battery of the vehicle is simulated to supply power to the remote VCI device, such that the stability and success rate of vehicle remote diagnosis can be improved.

10 Claims, 3 Drawing Sheets

100

(51) Int. Cl.
    *G06F 30/20*       (2020.01)
    *G07C 5/08*       (2006.01)

(56)              References Cited

FOREIGN PATENT DOCUMENTS

| | | | |
|---|---|---|---|
| CN | 105738825 | A | 7/2016 |
| CN | 105955146 | A | 9/2016 |
| CN | 106004794 | A | 10/2016 |
| CN | 106443545 | A | 2/2017 |
| CN | 106843196 | A | 6/2017 |
| CN | 107305372 | A | 10/2017 |
| CN | 109960237 | Y | 7/2019 |
| CN | 111273641 | A | 6/2020 |
| CN | 113253701 | A | 8/2021 |
| JP | 2004017676 | A | 1/2004 |
| JP | 2004302675 | A | 10/2004 |
| JP | 2010032480 | A | 2/2010 |

OTHER PUBLICATIONS

Machine Translation CN106443545 (Year: 2017).*
International Search Report of PCT Patent Application No. PCT/CN2022/086244 issued on Jun. 17, 2022.
Search report of CN application No. 202110436747.1 issued on Feb. 28, 2022.

\* cited by examiner

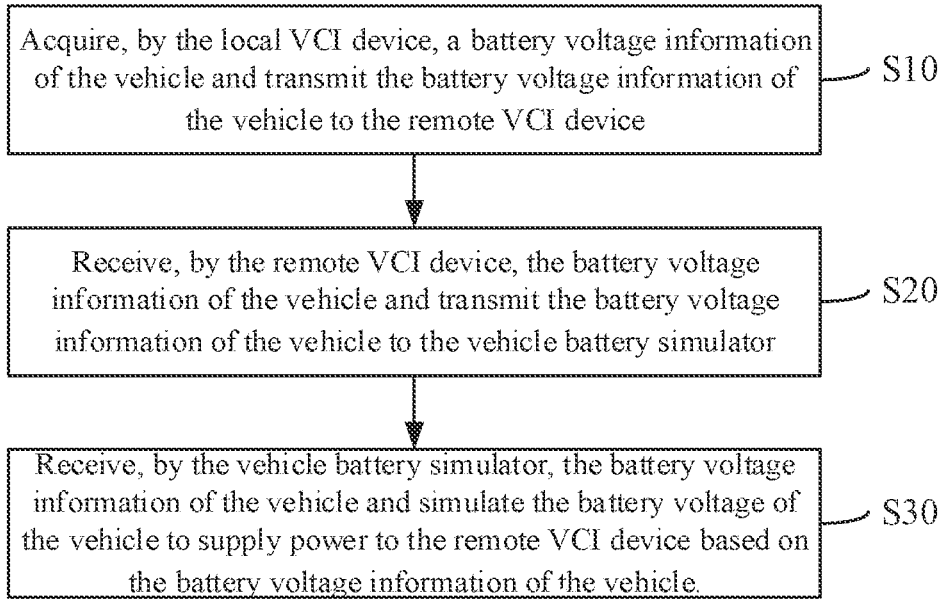

Acquire, by the local VCI device, a battery voltage information of the vehicle and transmit the battery voltage information of the vehicle to the remote VCI device    S10

Receive, by the remote VCI device, the battery voltage information of the vehicle and transmit the battery voltage information of the vehicle to the vehicle battery simulator    S20

Receive, by the vehicle battery simulator, the battery voltage information of the vehicle and simulate the battery voltage of the vehicle to supply power to the remote VCI device based on the battery voltage information of the vehicle.    S30

Figure 4

Output, by the control module, a corresponding control signal to the power supply stimulation according to battery voltage information of the vehicle    S301

Obtain, by the power supply module, a battery voltage of a vehicle according to a control signal output by the control module, and output the battery voltage of the vehicle to the remote VCI device    S302

VEHICLE REMOTE DIAGNOSIS SYSTEM AND METHOD

CROSS-REFERENCE TO RELATED APPLICATIONS

This application is the National Stage application for PCT patent application Serial No. PCT/CN2022/086244, filed on Apr. 12, 2022, which claims priority to Chinese Patent Application No. 202110436747.1, entitled "Vehicle Remote Diagnosis System and Method", filed to the National Intellectual Property Administration on Apr. 22, 2021, the entire contents of which are incorporated herein by reference.

TECHNICAL FIELD

The present application relates to the technical field of vehicle diagnosis, and in particular to a vehicle remote diagnosis system and method.

BACKGROUND OF THE INVENTION

A vehicle remote diagnosis is a diagnosis method in which, after a vehicle diagnosis device, such as a vehicle diagnosis instrument, is communicatively connected to an ECU (electronic control unit) of the vehicle via a communication interface device, a diagnosis command is transmitted to the ECU of the vehicle to obtain diagnostic data fed back by the ECU of the vehicle based on the diagnosis command. The vehicle diagnosis instrument can analyze the fault information of the vehicle according to the diagnostic data so that the professional can timely repair the vehicle when it is determined that the vehicle has failed. This diagnostic method is convenient and efficient because it does not require close contact with the vehicle.

Conventional remote diagnosis systems generally include a local VCI device (Vehicle Communication Interface), a remote VCI device, a VCI device, and a diagnosis device. The local VCI device is communicatively connected to the vehicle's ECU via the vehicle's OBD interface and is communicatively connected to the remote VCI device, which is connected to the original VCI device, which is connected to the diagnosis device.

Currently, remote VCI devices are typically powered from a fixed supply voltage, which has the following adverse effects: when the running state of the vehicle is unstable, for example, the running state of the vehicle is unstable due to the battery voltage drop of the vehicle (the running state instability may be that the vehicle electronics cannot achieve normal operation due to unstable power supply), since the local VCI device is powered by the battery of the vehicle, the local VCI device may become unstable due to unstable power supply, and the remote VCI device is communicatively connected to the local VCI device; when the local VCI device is unstable, the remote VCI device may also become unstable, and at this time, when data is transmitted between the local VCI device and the remote VCI device, there may be situations where data is lost, and in severe cases, there may even be situations where the system crashes and the remote diagnosis fails. In addition, when performing the remote diagnosis, the remote diagnosis side does not know the real-time running state of the vehicle, and if the real-time running state of the vehicle changes and the remote diagnosis side performs the diagnosis of the vehicle by programming according to the fact that the real-time running state of the vehicle is normal, the remote diagnosis side may fail to obtain the correct diagnostic result.

SUMMARY OF THE INVENTION

Embodiments of the present invention provide a vehicle remote diagnosis system and method capable of improving the stability and success rate of vehicle remote diagnosis.

The embodiments of the present invention provide the following technical solutions for solving the relevant technical problems:

In a first aspect, an embodiment of the present invention provides a vehicle remote diagnosis system including:

a local VCI device for connecting with the vehicle;

a remote VCI device communicatively connected to the local VCI device;

a vehicle battery simulator connected to the remote VCI device, the vehicle battery simulator configured to simulate the battery voltage of the vehicle to power the remote VCI device;

a vehicle diagnosis instrument connected to the remote VCI device, the vehicle diagnosis instrument for sending a diagnostic command to the remote VCI device to acquire diagnostic data fed back by the vehicle based on the diagnosis command.

Optionally, the vehicle battery simulator includes a control module and a power supply module;

the control module is connected to the remote VCI device and the control module is used for receiving battery voltage information of the vehicle acquired by the local VCI device via the remote VCI device, and outputting a first control signal according to the battery voltage information of the vehicle;

the power supply module is respectively connected to the control module and the remote VCI device, and the power supply module is used for outputting the battery voltage of the vehicle to the remote VCI device according to the first control signal.

Optionally, the vehicle battery simulator further comprises an alarm module;

the alarm module is connected to the control module, and the control module is used for outputting the second control signal to the alarm module so that the alarm module sends an alarm signal when it is determined that the battery voltage of the vehicle is less than a preset voltage threshold according to the battery voltage information of the vehicle.

Optionally, the local VCI device is configured with a first wireless communication module, and the remote VCI device is configured with a second wireless communication module;

the remote VCI device establishes a data communication connection with a first wireless communication module of the local VCI device through the second wireless communication module.

Alternatively, the first wireless communication module and the second wireless communication modules are WiFi modules, 4G wireless communication modules, or 5G wireless communication modules.

Optionally, the control module is further configured to:

after acquiring the battery voltage information of the vehicle, determining whether the battery voltage of the vehicle is less than a preset voltage threshold according to the battery voltage information of the vehicle;

performing a stop remote diagnosis operation if the battery voltage of the vehicle is less than a preset voltage threshold;

continuing the remote diagnosis operation if the battery voltage of the vehicle is greater than or equal to the preset voltage threshold.

Optionally, the control module performs a stop remote diagnosis operation comprising:

the control module transmits a stop diagnosis command to the vehicle diagnosis device through the remote VCI device so that the vehicle diagnosis device stops remote diagnosis according to the stop diagnosis command.

Optionally, the control module continues to determine whether the battery voltage of the vehicle is less than the preset voltage threshold based on the battery voltage information of the vehicle after performing the stop remote diagnosis operation;

continuing to perform a stop remote diagnosis operation if the battery voltage of the vehicle is less than the preset voltage threshold;

continuing the remote diagnosis operation if the battery voltage of the vehicle is greater than or equal to the preset voltage threshold.

In a second aspect, an embodiment of the present invention provides a vehicle remote diagnosis method applied to the vehicle remote diagnosis system as described above, the remote VCI device and the local VCI device performing data transmission based on a wireless network, the vehicle remote diagnosis method comprising the steps of:

acquiring, by the local VCI device, a battery voltage information of the vehicle and transmitting the battery voltage information of the vehicle to the remote VCI device;

receiving, by the remote VCI device, battery voltage information of the vehicle and transmitting the battery voltage information of the vehicle to a vehicle battery simulator;

receiving, by the vehicle battery simulator, battery voltage information of the vehicle, and simulating battery voltage of the vehicle to supply power to the remote VCI based on the battery voltage information of the vehicle.

Optionally, the vehicle battery simulator comprises a control module and a power supply module, the step of simulating the battery voltage of the vehicle to power the remote VCI device according to the battery voltage information of the vehicle, further comprises:

outputting, by the control module, a corresponding control signal to the power supply module according to battery voltage information of the vehicle;

obtaining, by the power supply module, a battery voltage of a vehicle according to a control signal output by the control module, and outputting the battery voltage of the vehicle to the remote VCI device.

Advantageous effects of embodiments of the present invention are: a vehicle remote diagnosis system and method are provided. The vehicle remote diagnosis system comprises a local VCI device, a remote VCI device, a vehicle battery simulator, and a vehicle diagnosis instrument, wherein the local VCI device is connected to a vehicle; the remote VCI device is communicatively connected with the local VCI device; the vehicle battery simulator is connected to the remote VCI device, and the vehicle battery simulator can simulate the battery voltage of the vehicle to supply power to the remote VCI device; the vehicle diagnosis instrument is connected to the remote VCI device; and the vehicle diagnosis instrument can send a diagnosis command to the vehicle by means of the remote VCI device and the local VCI device, so as to acquire diagnostic data, which is fed back by the vehicle on the basis of the diagnosis command. The battery voltage of the vehicle is simulated to supply power to the remote VCI device, such that the stability and success rate of vehicle remote diagnosis can be improved.

BRIEF DESCRIPTION OF DRAWINGS

The one or more embodiments are illustrated by way of example and not by way of limitation in the figures of the accompanying drawings, in which elements having the same reference numeral designations represent similar elements, and in which the figures are not to scale unless otherwise specified.

FIG. 4 is a flowchart illustrating a vehicle remote diagnosis method according to an embodiment of the present invention;

FIG. 5 is a flowchart of step S30 in FIG. 4.

DETAILED DESCRIPTION OF THE INVENTION

In order to facilitate an understanding of the present application, a more particular description of the application will be rendered by reference to the appended drawings and detailed description. It will be understood that when an element is referred to as being "connected" to another element, it can be directly connected to the other element or intervening elements may be present. Furthermore, the terms "first", "second", and the like are used for descriptive purposes only and are not to be construed as indicating or implying relative importance.

Unless defined otherwise, all technical and scientific terms used in the specification have the same meaning as commonly understood by one of ordinary skill in the art to which this invention belongs. The terminology used in the description of the invention herein is to describe particular embodiments only and is not intended to be limiting to the invention. As used herein, the term "and/or" includes any and all combinations of one or more of the associated listed items.

It should be noted that the technical features involved in the different embodiments of the present application described below can be combined with each other as long as they do not conflict with each other. In addition, although functional block partitioning is performed in a schematic diagram of an apparatus, a logical order is shown in a flowchart, in some cases, the steps shown or described may be performed in an order other than the functional block partitioning in the apparatus, or the flowchart. Furthermore, the terms "first", "second", and the like, as used herein, do not limit the scope of the claims to the data in which they are performed, but rather distinguish between the same or similar items that perform substantially the same function or function.

Figure 1:
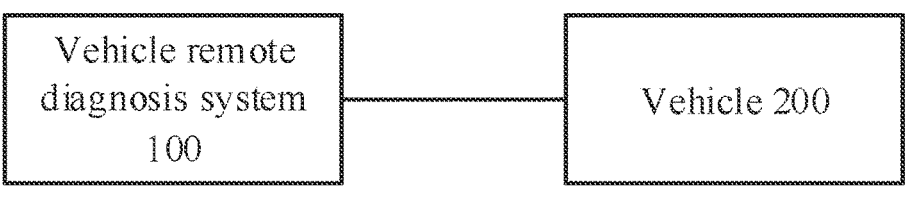
FIG. 1 is a schematic view showing an application environment of a vehicle remote diagnosis system according to an embodiment of the present invention.

Referring to FIG. 1, there is a schematic diagram of an application environment in which an embodiment of the present invention provides a vehicle remote diagnosis system. As shown in FIG. 1, the application environment includes a vehicle remote diagnosis system 100 and a vehicle 200.

The vehicle remote diagnosis system 100 is communicatively connected to vehicle 200 such that the vehicle remote diagnosis system 100 can transmit instructions/data to the vehicle 200 and/or receive parameters/data returned by the vehicle 200 to thereby enable remote diagnosis of the vehicle 200.

Figure 2:
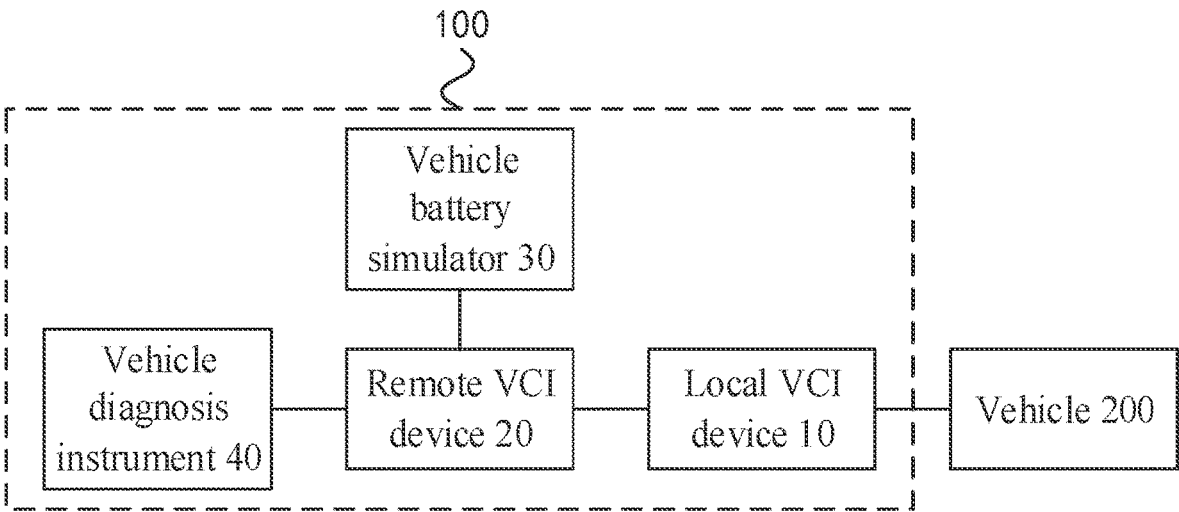
FIG. 2 is a schematic view showing the structure of a vehicle remote diagnosis system of FIG. 1.

Specifically, as shown in FIG. 2, the vehicle remote diagnosis system 100 includes a local VCI device 10, a remote VCI device 20, a vehicle battery simulator 30, and a vehicle diagnosis instrument 40.

Both the local VCI device 10 and the remote VCI device 20 are interface devices for the vehicle diagnosis instrument 40 to communicate with the vehicle 200 for protocol conversion to establish a communication link between the vehicle diagnosis instrument 40 and the vehicle 200.

Vehicle 200 may be any type of vehicle, such as a car, bus, heavy truck, etc., wherein an electronic control unit (Electronic Control Unit, ECU) is provided in the vehicle 200, the ECU records all the data/parameters of the vehicle 200, and the vehicle 200 can be remotely diagnosed by acquiring the data in the ECU.

ECU is a vehicle-specific microcomputer in use. Modern vehicles are more and more functional, and each subsystem of the vehicle needs a powerful ECU to control the operation of the system. For example, the transmission ECU adjusts the appropriate gear according to the current vehicle speed and rotation speed, and the air conditioner ECU automatically adjusts the temperature according to the current temperature.

The functions of ECU are logically divided into three types: logic control function, bus function, and diagnostic function.

The logic control function of the ECU, in short, is that the ECU acquires an input signal from a sensor or bus and outputs an action through an actuator after a series of operations.

The ECUs are not present in isolation in the on-board network, and information needs to be exchanged between the various ECUs, for example, the meter needs the rotation speed output by the engine to correctly display the current rotation speed. The bus function of the ECU refers to the function of the ECU to exchange data information in the in-vehicle network.

Once the entire vehicle is assembled, the various information hidden in the vehicle body is difficult to know. If the vehicle malfunctions, the diagnostic function of the ECU can be used to read the cause of the malfunction from the ECU through the vehicle diagnosis instrument, so that the maintenance can be performed more specifically.

The local VCI device 10 serves as an interface device that directly communicates with the vehicle 200, and connects with a OBD (On Board Diagnostics) interface on the vehicle 200 through its own communication interface so that the local VCI device 10 establishes a communication connection with the ECU of the vehicle 200.

The remote VCI device 20, as an interface device for indirect communication with the vehicle 200 and a key device for enabling the vehicle remote diagnosis, is communicatively connected with the local VCI device 10 and is connected with a vehicle diagnosis instrument 40, the vehicle diagnosis instrument 40 can forward transmitted data, such as a diagnosis command, to the local VCI device 10 via the remote VCI device 20, and then the local VCI device 10 transmits the data to the ECU of the vehicle 200 to read corresponding information, such as corresponding fault code information, from the ECU. The local VCI device 10 acquires diagnostic data such as fault code information from the ECU and then transmits the diagnostic data to the vehicle diagnosis instrument 40 via the remote VCI device 20 so that the vehicle diagnosis instrument 40 gives a diagnostic result according to the diagnostic data.

Figure 3:
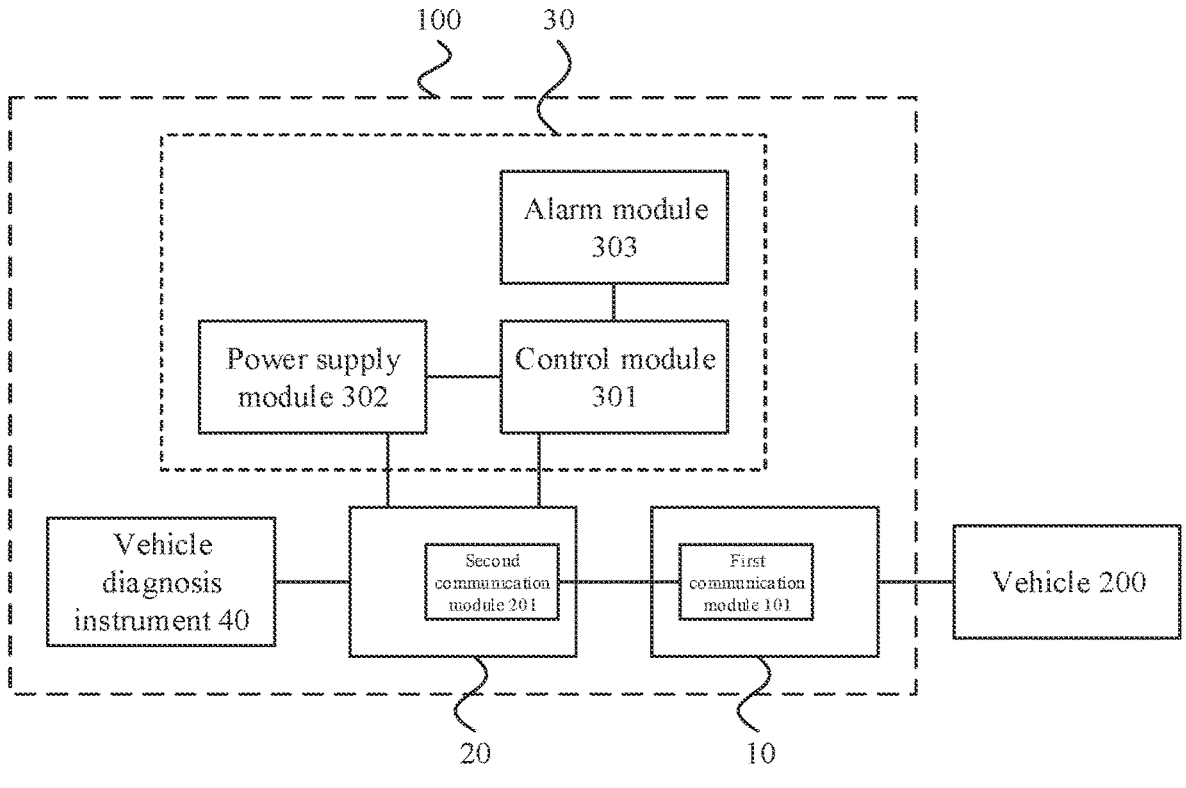
FIG. 3 is a schematic view showing the structure of another vehicle remote diagnosis system provided in FIG. 1.

The local VCI device 10 and the remote VCI device 20 may be communicatively connected by any suitable means of communication. In some embodiments, as shown in FIG. 3, the local VCI device 10 is configured with a first communication module 101, and the remote VCI device 20 is configured with a second communication module 201 through which the remote VCI device 20 establishes a data communication connection with the first communication module 101 of the local VCI device 10.

The first communication module 101 communicates with the second communication module 201 based on any of the same communication protocols or network protocols. In some embodiments, the first communication module 101 and the second communication module 102 are WiFi modules, 4G wireless communication modules, or 5G wireless communication modules. When the first communication module 201 and the second communication module 101 communicate via the WiFi mode, for example, the WiFi module (the second communication module 201) of the remote VCI device 20 accesses the Internet, and the WiFi module (the first communication module 101) of the local VCI device 10 accesses the Internet; with regard to the remote VCI device 20, data of the remote VCI device 20 can be transmitted to the local VCI device 10 via the Internet, or data sent by the local VCI device 10 is acquired via the Internet; with regard to the local VCI device 10, the data of the local VCI device 10 can be transmitted to the remote VCI device 20 via the Internet, or the data sent by the remote VCI device 20 can be acquired via the Internet.

The vehicle diagnosis instrument 40 may be any type of electronic device capable of diagnosing the vehicle 200, for example, it may be embodied as a diagnostic tablet computer having diagnostic software associated therewith.

Note that, although only one vehicle remote diagnosis system 100 and one vehicle 200 are shown in FIG. 1, it will be understood by those skilled in the art that the application environment may include more or less vehicle remote diagnosis systems 100 and vehicles 200 in practical applications, for example, the application environment includes one vehicle remote diagnosis system 100 and a plurality of vehicles 200.

The vehicle 200 is configured with a storage battery (for example, a lead-acid storage battery) for electrically supplying various vehicles in the vehicle 200; in order to ensure that the vehicle 200 electrically supplies various vehicles in a stable manner, so that the vehicle 200 can work normally and stably; in the process of electrically supplying various vehicles, the voltage of the storage battery cannot be too low; if the voltage of the storage battery is too low, the electrically supplying various vehicles in a stable manner cannot be ensured; at this moment, the vehicle 200 will work in an abnormal state or an unstable state; and if remote diagnosis of the vehicle 200 is performed at this moment, since the local VCI device 10 is powered by the storage battery of the vehicle 200, if the voltage of the storage battery decreases, the local VCI device 10 will become unstable due to unstable power supply, and during the remote diagnosis, the local VCI device 10 and the remote VCI device 20 are performing data interaction, and if the local VCI device 10 is unstable, the stability of the signal transmitted with the remote VCI device 20 will be affected, resulting in data loss, so that the vehicle diagnosis instrument 40 cannot obtain complete or correct diagnostic data, and thus cannot obtain the correct diagnostic results. In severe cases, the entire vehicle remote diagnosis system 100 will crash, failing remote diagnosis.

When the vehicle 200 needs to be diagnosed, the system of the vehicle 200 needs to be started up first; after the system of the vehicle 200 is started up, the storage battery of the vehicle 200 is powered up, and various vehicle electronics are started to be powered up, so as to ensure that the vehicle 200 operates in a stable state; however, as the diagnosis time increases, the power of the storage battery is continuously consumed, and the voltage of the storage battery also continuously decreases; when the voltage of the storage battery decreases to a certain extent, the vehicle 200 begins to operate in an abnormal or unstable state, which is extremely disadvantageous for remote diagnosis.

Based on this, the vehicle remote diagnosis system 100 incorporates a vehicle battery simulator 30 that can simulate the battery voltage of the vehicle 200 to power the remote VCI device 20. During remote diagnosis, the supply voltage of the remote VCI device 20 always follows the battery voltage of the vehicle 200.

Since the power supply voltage of the remote VCI is the battery voltage of the vehicle 200, rather than a fixed electric power supply voltage, when the battery voltage of the vehicle 200 fluctuates, the power supply voltage between the local VCI device 10 and the remote VCI will also fluctuate, so that the transmission of signals between the vehicle diagnosis instrument 40 and the remote VCI device 20 and between the remote VCI device and the local VCI device 10 will be more stable and less likely to lose data, so as to ensure that the vehicle diagnosis instrument 40 obtains complete and correct diagnostic data and then gives correct diagnostic results.

In some embodiments, as shown in FIG. 3, the vehicle battery simulator 30 includes a control module 301 and a power supply module 302.

The control module 301 is connected to the remote VCI device 20. The control module 301 receives the battery voltage information of the vehicle 200 acquired by the local VCI device 10 through the remote VCI device 20.

First, the local VCI device 10 establishes a communication connection with the ECU of the vehicle 200, the local VCI device 10 acquires the battery voltage information of the vehicle 200 from the ECU of the vehicle 200, then sends the battery voltage information of the vehicle 200 to the remote VCI device 20, and the remote VCI device 20 sends the received battery voltage information of the vehicle 200 to the control module 301.

When receiving the battery voltage information of the vehicle 200, the control module 301 outputs a first control signal to the power supply module 302 according to the battery voltage information of the vehicle 200.

The power supply module 302 is connected to the control module 301 and the remote VCI device 20, respectively.

Upon receiving the first control signal output by the control module 301, the power supply module 302 outputs a voltage consistent with the battery voltage of the vehicle 200 according to the first control signal, and outputs the voltage as a power supply voltage to the remote VCI device 20, so that the power supply voltage of the remote VCI follows or simulates the battery voltage of the vehicle 200.

The control module 301 may be any general-purpose processor, digital signal processor (DSP), application-specific integrated circuit (ASIC), field programmable gate array (FPGA), single chip microcomputer, ARM (Acorn RISC Machine), or other programmable logic device, discrete gate or transistor logic, discrete hardware components, or any combination of these components. Also, the control module 301 may be any conventional processor, controller, microcontroller, or state machine. The control module 301 may also be implemented as a combination of computing devices, e.g. a combination of a DSP and a microprocessor, a plurality of microprocessors, one or more microprocessors in conjunction with a DSP, and/or any other such configuration.

The local VCI device 10 and the remote VCT device 20 both have a power supply voltage range, when the power supply voltage of the local VCI device 10 and the remote VCI device 20 is too small, the local VCT device 10 and the remote VCI device 20 both become unstable due to power supply instability, and the local VCI device 10 and the remote VCI device 20 operating in an unstable state is disadvantageous for remote diagnosis.

Therefore, it is necessary to prompt the user when the power supply voltage of the local VCT device 10 and the remote VCI device 20 is too low so that the user can take corresponding measures.

As shown in FIG. 3, the vehicle battery simulator 30 further includes an alarm module 303 connected to a control module 301.

After receiving the battery voltage information of the vehicle 200 from the remote VCI device 20, the control module 301 also determines, according to the battery voltage information of the vehicle 200, that the battery voltage of the vehicle 200 is less than a preset voltage threshold (for example, the preset voltage threshold is 6V, but not limited thereto, and the preset voltage threshold can be set according to actual situations), for example, when it is determined that the battery voltage of the vehicle 200 is less than 6V, a second control signal is an output to the alarm module 303, and when the alarm module 303 receives the second control signal, an alarm signal is sent out. Here, the alarm module 303 includes a buzzer, an indicating lamp, and the like.

To better enable remote diagnosis of the vehicle 200, in some embodiments, the control module 301 determines whether the battery voltage of the vehicle 200 is less than a preset voltage threshold based on the battery voltage information of the vehicle 200 after acquiring the battery voltage information of the vehicle 200. When the battery voltage of the vehicle 200 is less than the preset voltage threshold, a stop remote diagnosis operation is performed, and when the stop remote diagnosis operation is performed, the control module 301 transmits a stop diagnosis command to the vehicle diagnosis instrument 40 through the remote VCI device 20 so that the vehicle diagnosis instrument 40 immediately stops the remote diagnosis according to the diagnosis command. When the battery voltage of the vehicle 200 is greater than or equal to the preset voltage threshold, the remote diagnosis operation is continued.

When the battery voltage of the vehicle 200 is less than the preset voltage threshold, the power supply voltage of the local VCI device 10 and the remote VCI device 20 is too small, and at this time, the local VCI device 10 and the remote VCI device 20 become unstable due to the unstable power supply, and thus, in order to avoid the failure of the remote diagnosis due to the system crash, the remote diagnosis needs to be temporarily stopped.

In some embodiments, after executing the stop remote diagnosis operation, the control module 301 continues to judge whether the battery voltage of the vehicle 200 is less than a preset voltage threshold according to the battery voltage information of the vehicle 200; if the battery voltage of the vehicle 200 is less than the preset voltage threshold, the control module 301 continues to execute the stop remote diagnosis operation; if the battery voltage of the vehicle 200 is greater than or equal to the preset voltage threshold, the control module 301 resumes the remote diagnosis operation, and when continuing the remote diagnosis operation, the control module 301 The start remote diagnosis instruction is transmitted to the vehicle diagnosis instrument 40 through the remote VCI device so that the vehicle diagnosis instrument 40 restarts the remote diagnosis according to the start remote diagnosis instruction.

Therefore, when the power supply voltage of the local VCI device 10 and the remote VCI device 20 is too low, stopping the remote diagnosis can avoid the situation that the local VCI device 10 and the remote VCI device 20 lose data or the system is dead due to the power supply instability, and when the power supply voltage of the local VCI device 10 and the remote VCI device 20 is normal, continuing the remote diagnosis. Thus, in this manner, it is possible to improve the stability and success rate of remote diagnosis.

As another aspect of the embodiment of the invention, the embodiment of the invention provides a vehicle remote diagnosis method that is applied to the vehicle diagnosis system 100 as described above. The data transmission between the local VCI device 10 and the remote VCI device 20 in the vehicle diagnosis system 100 is based on a wireless network.

Reference is now made to FIG. 4, which is a flowchart illustrating a vehicle remote diagnosis method according to an embodiment of the present invention. As shown in FIG. 4, the vehicle remote diagnosis method includes:

S10, acquiring, by the local VCI device 10, a battery voltage information of the vehicle and transmitting the battery voltage information of the vehicle to the remote VCI device 20;

S20, receiving, by the remote VCT device 20, the battery voltage information of the vehicle and transmitting the battery voltage information of the vehicle to the vehicle battery simulator 30;

S30, receiving, by the vehicle battery simulator 30, the battery voltage information of the vehicle and simulating the battery voltage of the vehicle to supply power to the remote VCI device 20 based on the battery voltage information of the vehicle.

Wherein the vehicle battery simulator 30 comprises a control module 301 and a power supply module 302, specifically, as shown in FIG. 5, step S30 further comprises:

S301, outputting, by the control module 301, a corresponding control signal to the power supply module 302 according to battery voltage information of the vehicle;

S302, obtaining, by the power supply module 302, a battery voltage of a vehicle according to a control signal output by the control module 301, and outputting the battery voltage of the vehicle to the remote VCI device 20.

Finally, it is to be understood that the present invention may be embodied in many different forms and should not be construed as limited to the embodiments set forth herein; rather, these embodiments are provided so that this disclosure will be thorough and complete. In addition, under the idea of the present invention, the above-mentioned technical features are continuously combined with each other, and there are many other changes in the above-mentioned different aspects of the present invention, which are all considered to be within the scope of the description of the present invention; further, it will be apparent to those skilled in the art from the foregoing description that all such modifications and variations are considered to fall within the scope of the appended claims.

The invention claimed is:

1. A vehicle remote diagnosis system, comprising:
a local VCI device for connecting with a vehicle;
a remote VCI device communicatively connected to the local VCI device;
a vehicle battery simulator connected to the remote VCI device, the vehicle battery simulator used for simulating a battery voltage of the vehicle to power the remote VCI device, so that the supply voltage of the remote VCI device follows the battery voltage of the vehicle;
a vehicle diagnosis instrument connected to the remote VCI device, the vehicle diagnosis instrument used for sending a diagnostic command to the remote VCI device to acquire diagnostic data fed back by the vehicle based on the diagnosis command.

2. The vehicle remote diagnosis system of claim 1, wherein the vehicle battery simulator comprises a control module and a power supply module;
the control module is connected to the remote VCI device and the control module is used for receiving battery voltage information of the vehicle acquired by the local VCI device via the remote VCI device, and outputting a first control signal according to the battery voltage information of the vehicle;
the power supply module is respectively connected to the control module and the remote VCI device, and the control module is used for outputting the battery voltage of the vehicle to the remote VCI device according to the first control signal.

3. The vehicle remote diagnosis system of claim 2, wherein the vehicle battery simulator further comprises an alarm circuit;
the alarm circuit is connected to the control module, and the control module is used for outputting a second control signal to the alarm circuit so that the alarm circuit sends an alarm signal when it is determined that the battery voltage of the vehicle is less than a preset voltage threshold according to the battery voltage information of the vehicle.

4. The vehicle remote diagnosis system of claim 3, wherein the local VCI device is configured with a first wireless communication module and the remote VCI device is configured with a second wireless communication module;
the remote VCI device establishes a data communication connection with a first wireless communication module of the local VCI device through the second wireless communication module.

5. The vehicle remote diagnosis system of claim 4, wherein the first wireless communication module and the second wireless communication module are a WiFi module, a 4G wireless communication module, or a 5G wireless communication module.

6. The vehicle remote diagnosis system of claim 2, wherein the control module is further used to:
after acquiring the battery voltage information of the vehicle, determining whether the battery voltage of the vehicle is less than a preset voltage threshold according to the battery voltage information of the vehicle;
performing a stop remote diagnosis operation if the battery voltage of the vehicle is less than a preset voltage threshold;
continuing the remote diagnosis operation if the battery voltage of the vehicle is greater than or equal to the preset voltage threshold.

7. The vehicle remote diagnosis system of claim 6, wherein performing a stop remote diagnosis operation by the control module comprises:

the control module transmits a stop diagnosis command to the vehicle diagnosis device through the remote VCI so that the vehicle diagnosis device stops the remote diagnosis according to the stop diagnosis command.

8. The vehicle remote diagnosis system of claim 6, wherein the control module continues to determine whether the battery voltage of the vehicle is less than the preset voltage threshold based on the battery voltage information of the vehicle after performing the stop remote diagnosis operation;

continuing to perform a stop remote diagnosis operation if the battery voltage of the vehicle is less than the preset voltage threshold;

continuing the remote diagnosis operation if the battery voltage of the vehicle is greater than or equal to the preset voltage threshold.

9. A vehicle remote diagnosis method, wherein as applied to the vehicle remote diagnosis system of claim 1, data is transmitted between a remote VCI device and a local VCI device over a wireless network, the vehicle remote diagnosis method comprising the steps of:

acquiring, by the local VCI device, a battery voltage information of the vehicle and transmitting the battery voltage information of the vehicle to the remote VCI device;

receiving, by the remote VCI device, battery voltage information of the vehicle and transmitting the battery voltage information of the vehicle to a vehicle battery simulator;

receiving, by the vehicle battery simulator, battery voltage information of the vehicle, and simulating the battery voltage of the vehicle to supply power to the remote VCI device based on the battery voltage information of the vehicle, so that the supply voltage of the remote VCI device follows the battery voltage of the vehicle.

10. The vehicle remote diagnosis method of claim 9, wherein the vehicle battery simulator comprises a control module and a power supply module, the step of simulating the battery voltage of the vehicle to power the remote VCI device according to the battery voltage information of the vehicle, further comprising:

outputting, by the control module, a corresponding control signal to the power supply module according to the battery voltage information of the vehicle;

obtaining, by the power supply module, a battery voltage of a vehicle according to a control signal output by the control module, and outputting the battery voltage of the vehicle to the remote VCI device.

* * * * *